US010593742B2

(12) United States Patent
Ma et al.

(10) Patent No.: US 10,593,742 B2
(45) Date of Patent: Mar. 17, 2020

(54) DISPLAY DEVICE

(71) Applicant: Japan Display Inc., Minato-ku (JP)

(72) Inventors: Chunche Ma, Minato-ku (JP); Hajime Akimoto, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/115,744

(22) Filed: Aug. 29, 2018

(65) Prior Publication Data

US 2019/0074339 A1    Mar. 7, 2019

(30) Foreign Application Priority Data

Sep. 1, 2017  (JP) ................................ 2017-168847

(51) Int. Cl.
 *H01L 27/32* (2006.01)
 *H01L 51/52* (2006.01)
(52) U.S. Cl.
 CPC ........ *H01L 27/3258* (2013.01); *H01L 27/323* (2013.01); *H01L 27/3246* (2013.01); *H01L 27/3276* (2013.01); *H01L 27/3211* (2013.01); *H01L 51/5253* (2013.01)
(58) Field of Classification Search
 CPC ........................... H01L 27/323; H01L 27/3246
 See application file for complete search history.

(56) References Cited

U.S. PATENT DOCUMENTS

| 2009/0203285 | A1* | 8/2009 | Kobayashi | H01L 27/3211 445/58 |
| 2010/0200875 | A1* | 8/2010 | Takei | H01L 27/3244 257/91 |
| 2014/0027792 | A1* | 1/2014 | Iwasaki | H01L 33/08 257/88 |
| 2015/0280130 | A1* | 10/2015 | Sago | H01L 51/0005 257/99 |
| 2015/0333111 | A1* | 11/2015 | Sato | H01L 27/3246 257/40 |
| 2018/0108853 | A1* | 4/2018 | Kanaya | G02F 1/133308 |
| 2018/0138458 | A1* | 5/2018 | Tokuda | H01L 27/3246 |

FOREIGN PATENT DOCUMENTS

JP    2005-222091    8/2005

* cited by examiner

*Primary Examiner* — Caridad Everhart
*Assistant Examiner* — Ankush K Singal
(74) *Attorney, Agent, or Firm* — Oblon, McClelland, Maier & Neustadt, L.L.P.

(57) ABSTRACT

A display device according to an embodiment of the present invention includes: a first substrate; light emitting elements arranged on the first substrate and including electrodes; a first insulation layer covering an edge of each of the electrodes on the first substrate; a second insulating section arranged on the light emitting elements and overlapping with the light emitting elements in plan view; a third insulating section arranged the banks, overlapping with the banks in plan view and having a lower refractive index than a refractive index of the second insulating section.

12 Claims, 7 Drawing Sheets

DISPLAY DEVICE

CROSS-REFERENCE TO RELATED APPLICATION

The present application claims priority from Japanese application JP2017-168847 filed on Sep. 1, 2017, the content of which is hereby incorporated by reference into this application.

BACKGROUND OF THE INVENTION

1. Field of the Invention

The present invention relates to a display device.

2. Description of Related Art

JP 2005-222091A discloses an electronic apparatus having a module including a display device, which has a structure in which a touch sensor is provided in an upper part of the display device.

In such touch sensor, indium tin oxide is generally used for electrodes for the touch sensor, however, current transmission speed between electrodes becomes slow as the size of the touch sensor is increased because of a high resistance value. Accordingly, development of so-called metal mesh electrodes is expected, in which a metal thin layer with a low resistance value is microfabricated to form electrodes by metal thin wire.

SUMMARY OF THE INVENTION

In the above related-art structure, there is a problem that light extraction efficiency is not good. That is, the light extraction efficiency is deteriorated as electrodes provided in the touch sensor block light emitted from light-emitting elements.

(1) A display device according to an embodiment of the present invention includes: a first substrate; light emitting elements arranged on the first substrate and including electrodes; a first insulation layer covering an edge of each of the electrodes on the first substrate; a second insulating section arranged on the light emitting elements and overlapping with the light emitting elements in plan view; a third insulating section arranged the banks, overlapping with the banks in plan view and having a lower refractive index than a refractive index of the second insulating section.

(2) In the display device as described in (1) above, further includes: a touch sensor arranged on the second insulating section and the third insulating section and having a metal thin wire overlapping with the third insulating section in plan view.

(3) In the display device as described in (2) above, the metal thin wire overlaps with the first insulating layer without overlapping with the third insulating section in plan view.

(4) In the display device as described in (2) above, a width of the metal thin wire is equal to or smaller than a width of the third insulating section.

(5) In the display device as described in (1) above, the second insulating section and the third insulating section are formed in the same layer.

(6) In the display device as described in (2) above, the second insulating section and the third insulating section are formed in the same layer.

(7) In the display device as described in (4) above, further includes: a first inorganic insulating layer arranged between the second insulating section and the light emitting elements and between the third insulating section and the first insulation layer.

(8) In the display device as described in (4) above, further includes: a second inorganic insulating layer, the second insulating section is between the first inorganic layer and the second inorganic layer, and the third insulating section is between the first inorganic layer and the second insulating section.

(9) In the display device as described in (2) above, a cross-sectional shape of the metal thin wire is a substantially trapezoidal shape.

(10) In the display device as described in (1) above, a difference between the refractive index of the second insulating section and the refractive index of the third insulating section is greater than 0.3.

(11) In the display device as described in (1) above, a relative dielectric constant of the third insulating section is less than 3.

(12) In the display device as described in (1) above, the refractive index of the second insulating section is greater than 1.75.

DETAILED DESCRIPTION OF THE INVENTION

Figure 1:
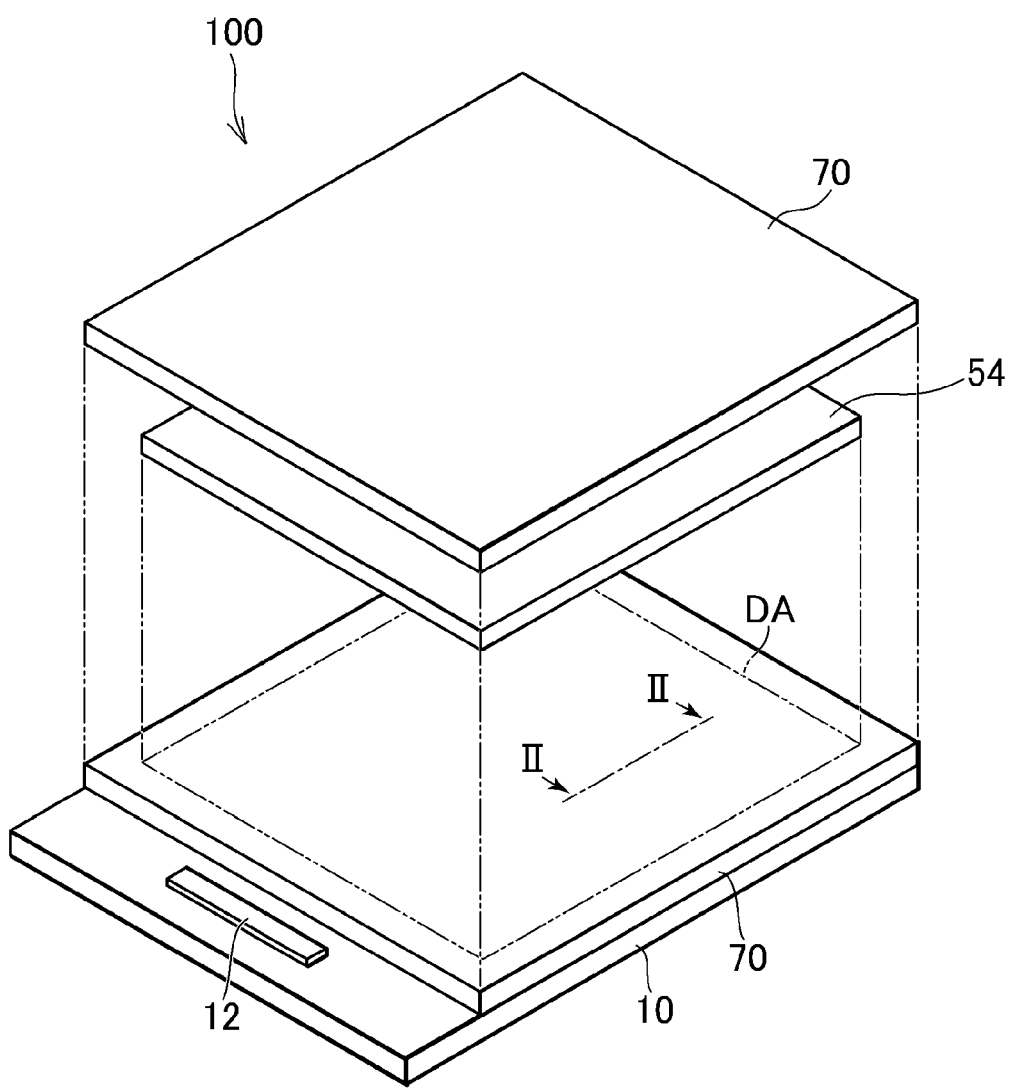
FIG. 1 is a perspective view of a display device according to an embodiment.

Hereinafter, the embodiment will be explained with reference to the drawings. Note that the present invention may be achieved in various manners within a scope not departing from the gist thereof and should not be interpreted in a manner limited to the contents of the embodiment to be described below as examples.

In the drawings, widths, thicknesses, shapes and so on of respective portions may be schematically shown as compared with actual manners for making explanation more clear, and these are just examples and do not intend to limit the interpretation of the present invention. In the specification and respective drawings, the same reference numerals are given to components having functions similar to those explained in the foregoing drawing, and repeated explanation may be omitted.

Moreover, when the positional relationship between a certain component and another component is defined in the detailed explanation of the present invention, "above", "on", "below" and "under" include not only cases where another component is positioned directly above or directly below but also cases where further another component is interposed therebetween as far as there is no particular remark.

FIG. 1 is a perspective view of a display device 100 according to the embodiment. An organic electroluminescence display device is cited as an example of the display device 100. The display device 100 forms full color pixels by combining unit pixels (sub-pixels) of plural colors including, for example, red, green and blue to display a full color image. The display device 100 has a display area DA in which plural pixels are arranged in matrix. The display device 100 also has a touch sensor 54, and the touch sensor 54 is provided so as to cover the display area DA. The display device has a first substrate 10. An integrated circuit chip 12 for driving elements for displaying images is mounted on the first substrate 10, and a not-shown flexible printed substrate may be connected for electrical connection to the outside.

Figure 2:
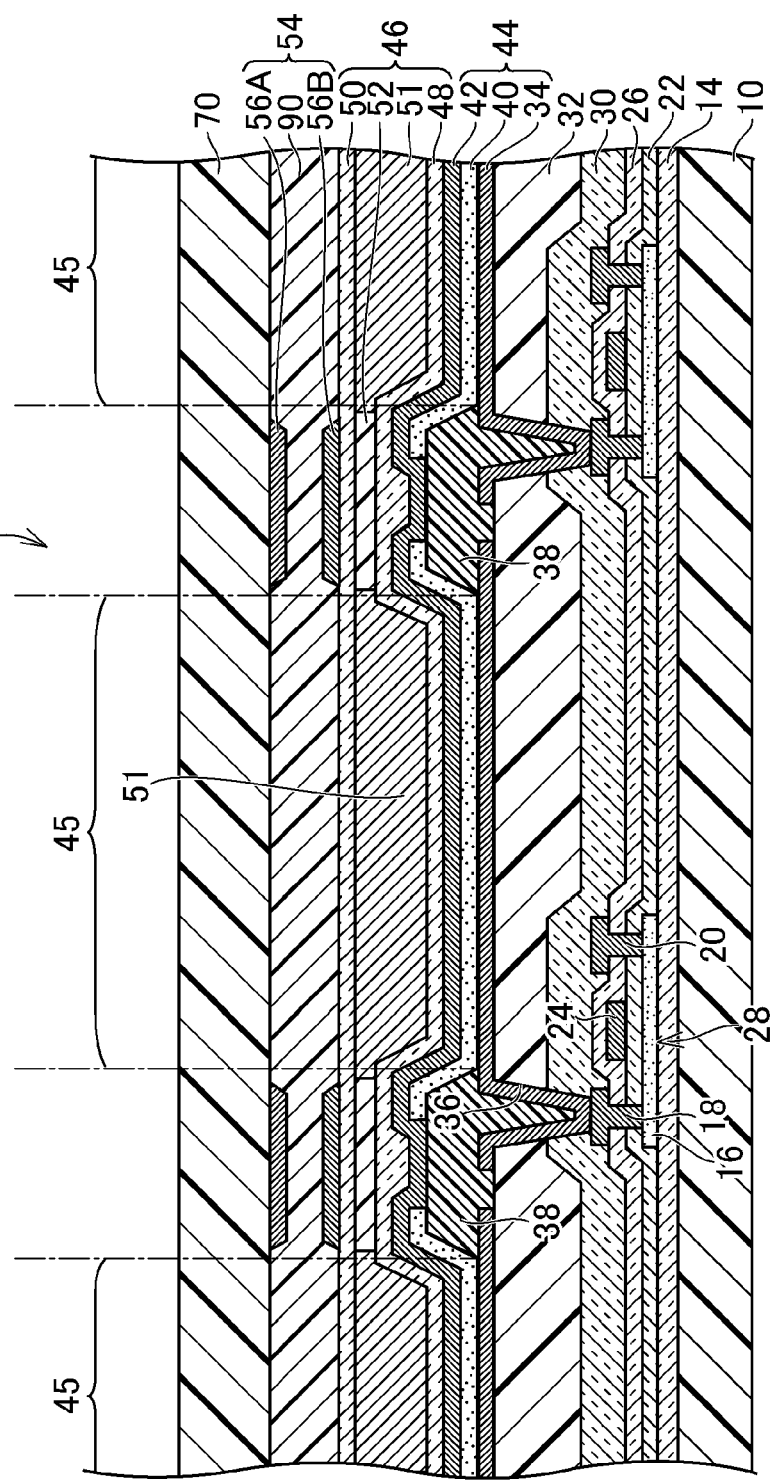
FIG. 2 is an enlarged view showing a cross section taken along II-II line of the display device shown in FIG. 1, omitting part thereof.

FIG. 2 is an enlarged view showing a cross section taken along II-II line of the display device 100 shown in FIG. 1, omitting part thereof. The first substrate 10 is formed of resin or glass and may be a layer having flexibility such as polyimide and polyethylene telephthalate. On the first substrate 10, an undercoat layer 14 to be a barrier with respect to impurities contained in the substrate itself. The undercoat layer 14 is formed of a silicon oxide layer, a silicon nitride layer or the like, and may be a stacked structure of them. A semiconductor layer 16 is formed on the undercoat layer 14. A gate insulating layer 22 is formed on the semiconductor layer 16 so as to cover the semiconductor layer 16. Gate electrodes 24 are formed on the gate insulating layer 22 and an interlayer insulating layer 26 is formed so as to cover the gate electrodes 24. Source electrodes 18 and drain electrodes 20 penetrate the gate insulating layer 22 and the interlayer insulating layer 26 and are electrically connected to the semiconductor layer 16. The semiconductor layer 16, the source electrode 18, the drain electrode 20 and the gate electrode 24 form a thin-film transistor 28. A passivation layer 30 is provided so as to cover the thin-film transistor 28.

A planarization layer 32 is provided over the passivation layer 30. On the planarization layer 32, a plurality of pixel electrodes 34 formed so as to correspond to respective plural unit pixels (sub-pixels) are provided. In the embodiment, the plural pixel electrodes 34 are formed as a cathode. The planarization layer 32 is formed so that at least a surface on which the pixel electrodes 34 are formed is planarized. As the planarization layer 32, organic materials such as photosensitive acrylic resin are used in many cases. The pixel electrode 34 is electrically connected to one of the source electrode 18 and the drain electrode 20 on the semiconductor layer 16 by a contact hole 36 penetrating the planarization layer 32 and the passivation layer 30.

An insulating layer 38 is formed on the planarization layer 32 and the pixel electrodes 34. The insulating layer 38 is placed on a peripheral portion of each pixel electrode 34 and formed so that part of the pixel electrode 34 (for example, a central part) opens. A bank surrounding part of the pixel electrode 34 is formed by the insulating layer 38.

Light emitting layers 40 are provided over the pixel electrodes 34. The light emitting layers 40 are provided separately on respective pixel electrodes 34 so that part thereof is placed also on the insulating layer 38. In the embodiment, each of the plural light emitting layers 40 emits any one color of blue, red and green corresponding to respective pixels. Colors corresponding to respective pixels are not limited to the above and, for example, yellow, white and so on may be included. The light emitting layers 40 are formed by, for example, deposition. Note that the light emitting layers 40 may be formed on the entire surface covering the display area DA shown in FIG. 1 so as to spread over plural pixels. That is, the light emitting layers 40 may be formed so as to continue on the insulating layer 38. In the case where the light emitting layers 40 are formed so as to cover plural pixels, a structure in which all sub-pixels emit white and desired color wavelength components are taken out through a not-shown color filter will be adopted. In this case, the light emitting layers 40 can be formed by coating using solvent dispersion.

A counter electrode 42 is provided over the light emitting layers 40. In the embodiment, the counter electrode 42 is an anode, which is configured as a common electrode provided over the plural unit pixels. The counter electrode 42 is arranged also on the insulating layer 38 to be banks. A light emitting element 44 including the light emitting layer 40, the pixel electrode 34 and the counter electrode 42 which sandwich the light emitting layer 40 is formed. Each of the plural unit pixels has the light emitting element 44. The light emitting layer 40 is sandwiched between the pixel electrode 34 and the counter electrode 42, emitting light while luminance is controlled by an electric current flowing between the both. In FIG. 2, portions where the pixel electrodes 34, the light emitting layers 40 and the counter electrode 42 overlap with one another are light emitting areas 45. Areas where the banks are provided are non-light emitting areas. It is also preferable to provide at least one layer of a not-shown hole transport layer and hole injection layer between the light emitting layers 40 and the pixel electrodes 34. It is also preferable to provide at least one layer of a not-shown electron transport layer and electron injection layer between the light emitting layers 40 and the counter electrode 42.

The light emitting elements 44 are sealed by being covered with a sealing layer 46 stacking on the counter electrode 42 and shielded from moisture. The sealing layer 46 may be formed by one layer as well as having a stacked structure including plural layers. In the embodiment, the sealing layer 46 has a stacked structure including, for example, a pair of first inorganic insulating layer 48 and second inorganic insulating layer 50 made of silicon nitride or the like, a first insulating layer 51 and a second insulating later 52 made of an organic matter such as resin, which are provided between the first inorganic insulating layer 48 and the second inorganic insulating layer 50 as shown in FIG. 2. The sealing layer 46 covers the display area DA shown in FIG. 1.

Here, an arrangement relation between the first insulating layer 51 and the second insulating layer 52 will be explained. The first insulating layer 51 is arranged above the light emitting elements 44 so as to overlap with the light emitting elements 44 in plan view. The second insulating layer 52 is arranged above the banks arranged on the sides of the light emitting elements 44 so as to overlap with the banks in plan view. In the embodiment, the first insulating layer 51 and the second insulating layer 52 are formed in the same layer, however, the thickness of the second insulating layer 52 is thinner than that of the first insulating layer 51 as the second insulating layer 52 is formed above the banks, and side surfaces of the second insulating layer 52 touch part of side surfaces of the first insulating layer 51.

Here, a refractive index of the second insulating layer 52 is set to be lower than a refractive index of the first insulating layer 51. According to the structure, light is emitted from light emitting element 44 in the light emitting area 45, but the light emitted in an oblique direction is reflected on an interface between the first insulating layer 51 and the second insulating layer 52, therefore, light is taken out from an upper part of the light emitting element 44, not from an upper part of the bank.

As the second insulating layer 52, materials with a relative dielectric constant less than 3 are preferably used, which are, for example, polyimide, polynorbornene, polyarylether and so on. As the first insulating layer 51, a light transmissive organic compound with a refractive index greater than 1.75 is preferably used. A difference between the refractive index of the first insulating layer 51 and the refractive index of the second insulating layer 52 is preferably greater than 0.3. This is for allowing light emitted in an oblique direction from light emitting element 44 to be reflected on the interface between the first insulating layer 51 and the second insulating layer 52.

As a method of manufacturing the first insulating layer 51 and the second insulating layer 52, for example, the second insulating layer 52 is formed by ink-jet printing on the entire upper surface of the first inorganic insulating layer 48 after the light emitting elements 44 are formed. After that, the second insulating layer 52 is removed only at areas where the second insulating layer 52 overlaps with the light emitting elements 44 in plan view by dry etching or wet etching. After that, the first insulating layer 51 having a higher refractive index than that of the second insulating layer 52 is formed by ink-jet printing again. After that, the second inorganic insulating layer 50 is formed by a CVD process and so on.

The touch sensor 54 is arranged above the first insulating layer 51 and the second insulating layer 52. The touch sensor 54 includes a touch sensor base material 90, electrodes 56A and 56B, and the touch sensor base material 90 is interposed between the electrodes 56A and 56B.

The touch sensor base material 90 is made of materials having insulation properties and high light transmitting properties such as resins, glass and silicon. As resins, for example, polyethylene telephthalate, polylactic acid, polyethylene naphthalate, polyethylene, polypropylene, polystyrene, EVA, polyamide, polyimide, acrylic resin and so on can be used.

As the electrodes 56A and 56B, metal thin wire formed of a metal or an alloy selected from a group of, for example, gold, copper, silver, nickel, aluminum and molybdenum. A mesh structure is formed by such metal thin wire to thereby configure the electrodes 56A and 56B. As a detection method of the touch sensor 54, for example, an electrostatic capacitive type can be adopted, and the method is not particularly limited insofar as the electrodes 56A and 56B are included.

The electrodes 56A and 56B are arranged so as to overlap with the second insulating layer 52 in plan view. A structure in which widths of the electrodes 56A and 56B are the same as a width of the second insulating layer 52 is shown in the example shown in FIG. 3, and the widths of the electrodes 56A and 56B are preferably equal to or smaller than the width of the second insulating layer 52. That is, the structure in which the electrodes 56A and 56B do not overlap with the first insulating layer 51 in plan view is adopted. A structure in which only one of the electrodes 56A and 56B exists may be adopted as well as it is not always necessary that the electrodes 56A and 56B are arranged so as to overlap each other.

Figure 4:
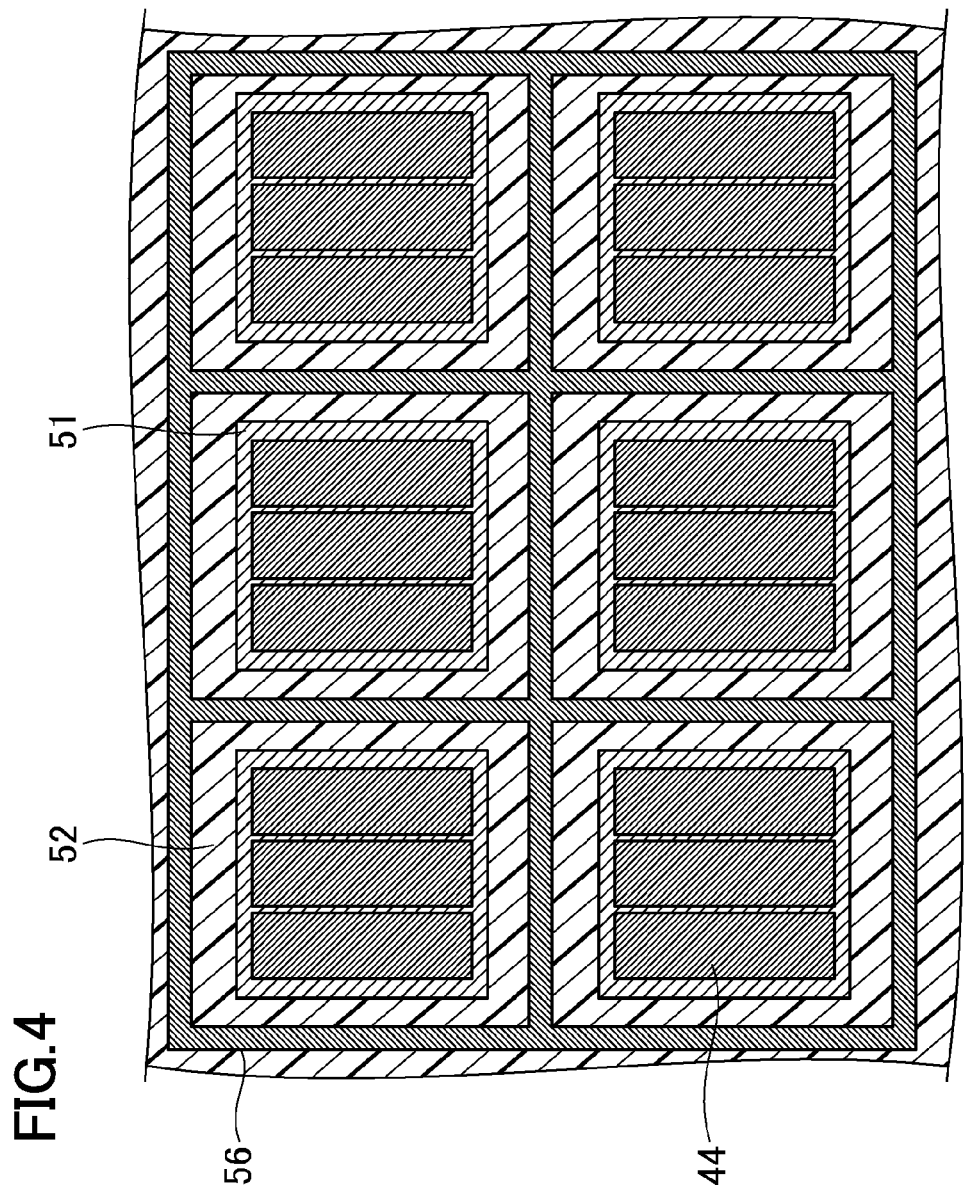
FIG. 4 is a plan view showing an arrangement relation of electrodes, light-emitting elements, a first insulating layer and a second insulating layer in the display device according to the embodiment.

FIG. 4 is a plan view showing an arrangement relation of electrodes 56, the light emitting elements 44, the first insulating layer 51 and the second insulating layer 52 of the display device according to the embodiment.

In the example shown in FIG. 4, three light emitting elements 44 light emission colors of which are respectively red, green and blue are defined as a set to form one pixel. The first insulating layer 51 is formed so as to overlap with the respective light emitting areas 45 of the three light emitting elements 44 in plan view. The not-shown banks are formed between the plural pixels, and the second insulating layer 52 is formed so as to overlap with the banks in plan view. Furthermore, the electrodes 56 are arranged so as to overlap with the second insulating layer 52. The electrodes 56 are arranged between respective pixels, and one pixel is arranged in one rectangular area surrounded by the electrodes 56.

According to the above structure, light extraction efficiency can be improved. That is, the refractive index of the second insulating layer 52 is lower than the refractive index of the first insulating layer 51 as described above, therefore, light is emitted from light emitting element 44, but the light emitted in an oblique direction is reflected on the interface between the first insulating layer 51 and the second insulating layer 52. Accordingly, light can be taken out from the upper part of the light emitting element 44 where the electrode 56 is not arranged, not from the upper part of the bank 38 where the electrode 56 is arranged. As a result, it suppresses inhibition of a light path from the light emitting element 44 by the electrode 56 and to improve light extraction efficiency. It also suppresses occurrence of color difference in a light viewing angle.

Furthermore, the relative dielectric constant of the second insulating layer 52 is inevitably lower than a relative dielectric constant of the first insulating layer 51 from the relation between the refractive index of the second insulating layer 52 and the refractive index of the first insulating layer 51. As a result, it is possible to reduce stray capacity generated between the electrodes 56 and the counter electrode 42 in the light emitting elements 44.

It is also preferable to form a cross-sectional shape of the electrode 56 to have an substantially trapezoidal shape in which an upper bottom is shorter than a lower bottom as shown in FIG. 2 in the embodiment. When such shape is adopted, light emitted in the oblique direction from the upper surface of the first insulating layer 51 is blocked by the upper bottom of the electrode 56 can be further reduced.

Figure 3:
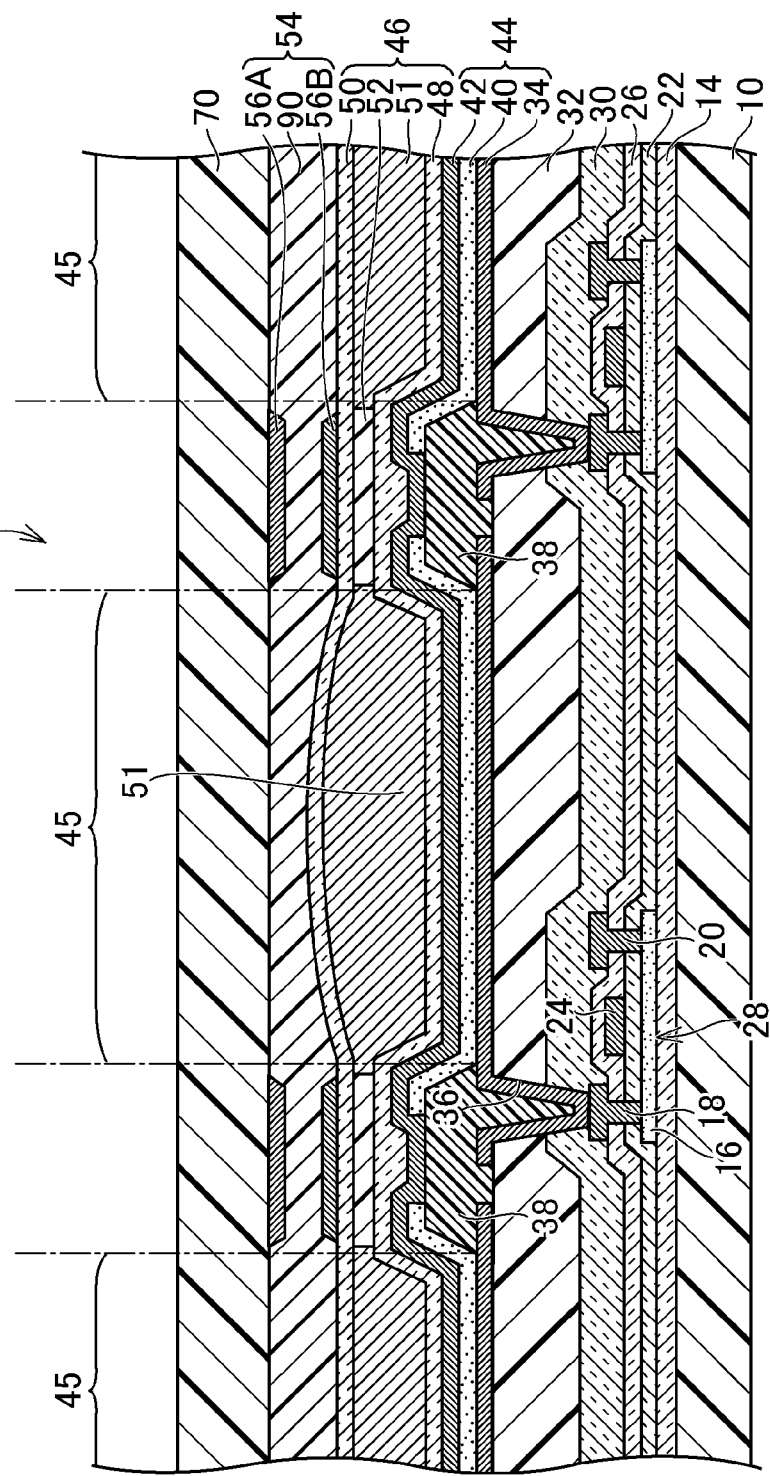
FIG. 3 is an enlarged view showing a cross section taken along II-II line of the display device shown in FIG. 1, omitting part thereof.

It may adopt a structure in which the first insulating layer 51 has a microlens structure by curving the upper surface of the first insulating layer 51 to have an upward convex shape as shown in FIG. 3. According to the structure, higher outcoupling efficiency can be obtained and light extraction efficiency can be further improved. It suppresses occurrence of color difference in the light viewing angle. The microlens structure can be formed in the above-described ink-jet printing process.

Figure 5:
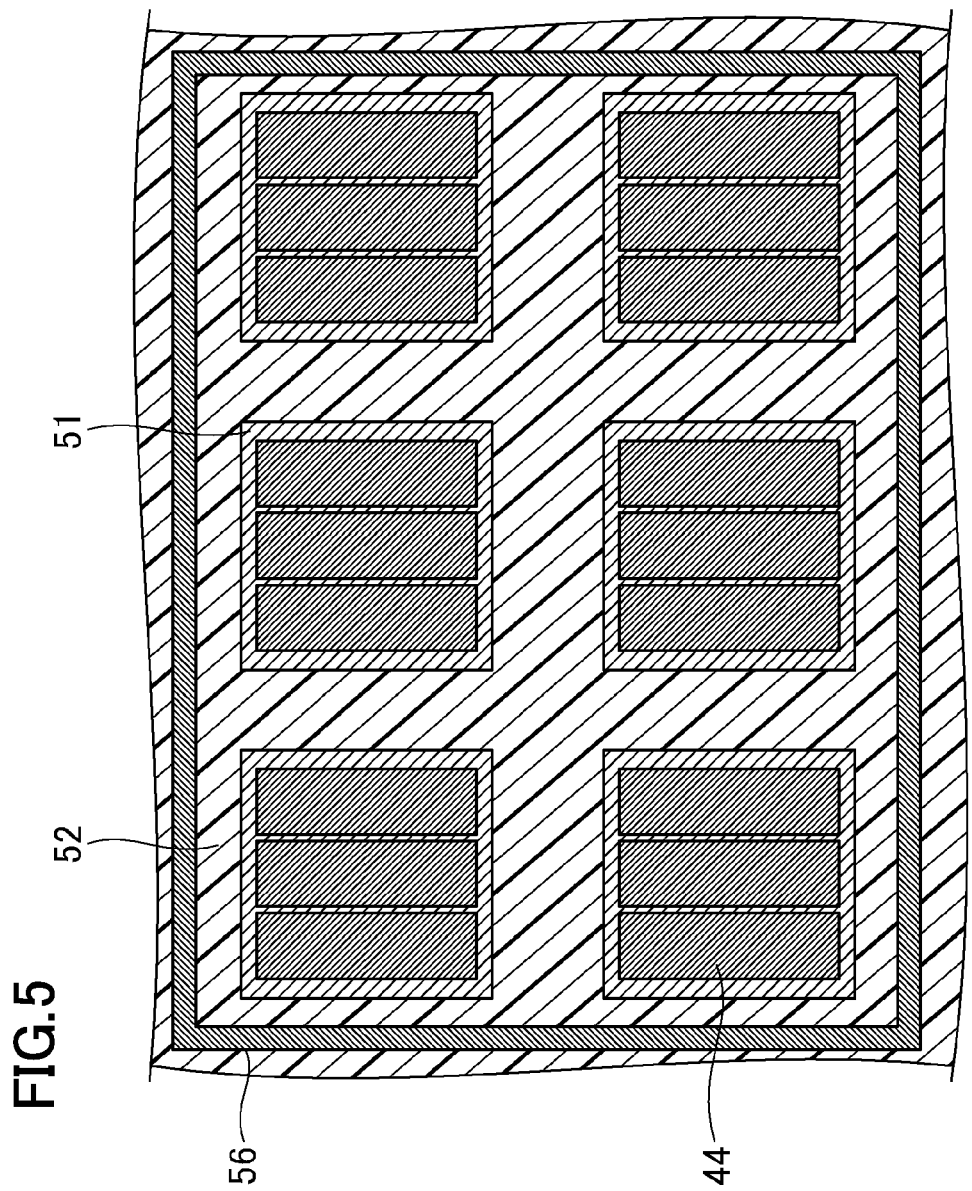
FIG. 5 is a plan view showing an arrangement relation of the electrodes, the light-emitting elements, the first insulating layer and the second insulating layer in the display device according to the embodiment.

In the example shown in FIG. 4, the structure in which one pixel is arranged in one rectangular area surrounded by the electrodes 56 is explained as an example. A structure in which plural pixels are arranged in one rectangular area surrounded by the electrodes 56 as shown in FIG. 5 may also be adopted. The first insulating layer 51 is formed in structure areas of respective pixels and the second insulating layer 52 is formed among respective pixels. According to the structure, a large number of light emitting elements 44 can be arranged in a limited area.

Figure 6:
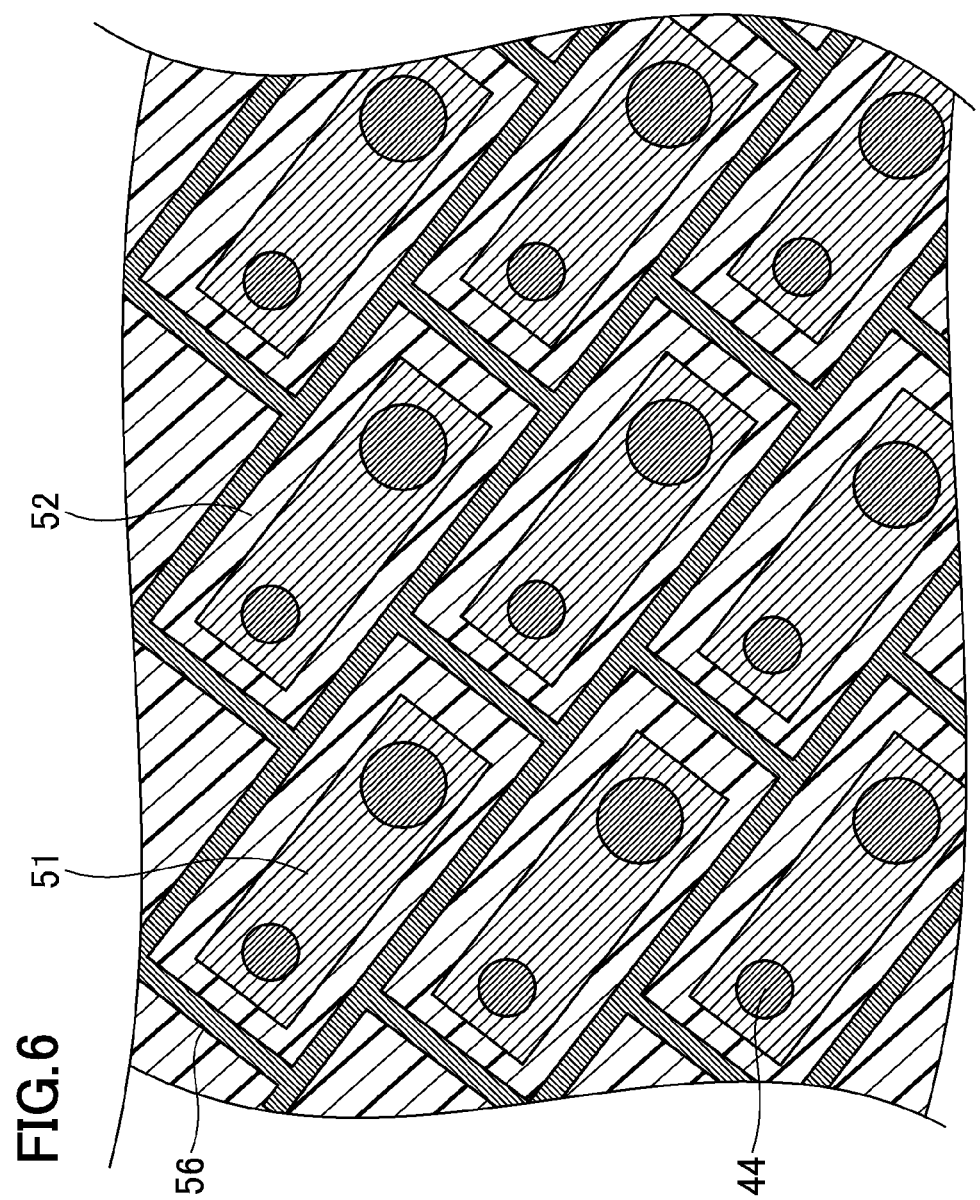
FIG. 6 is a plan view showing an arrangement relation of the electrode, the light-emitting elements, the first insulating layer and the second insulating layer in the display device according to the embodiment.
Figure 7:
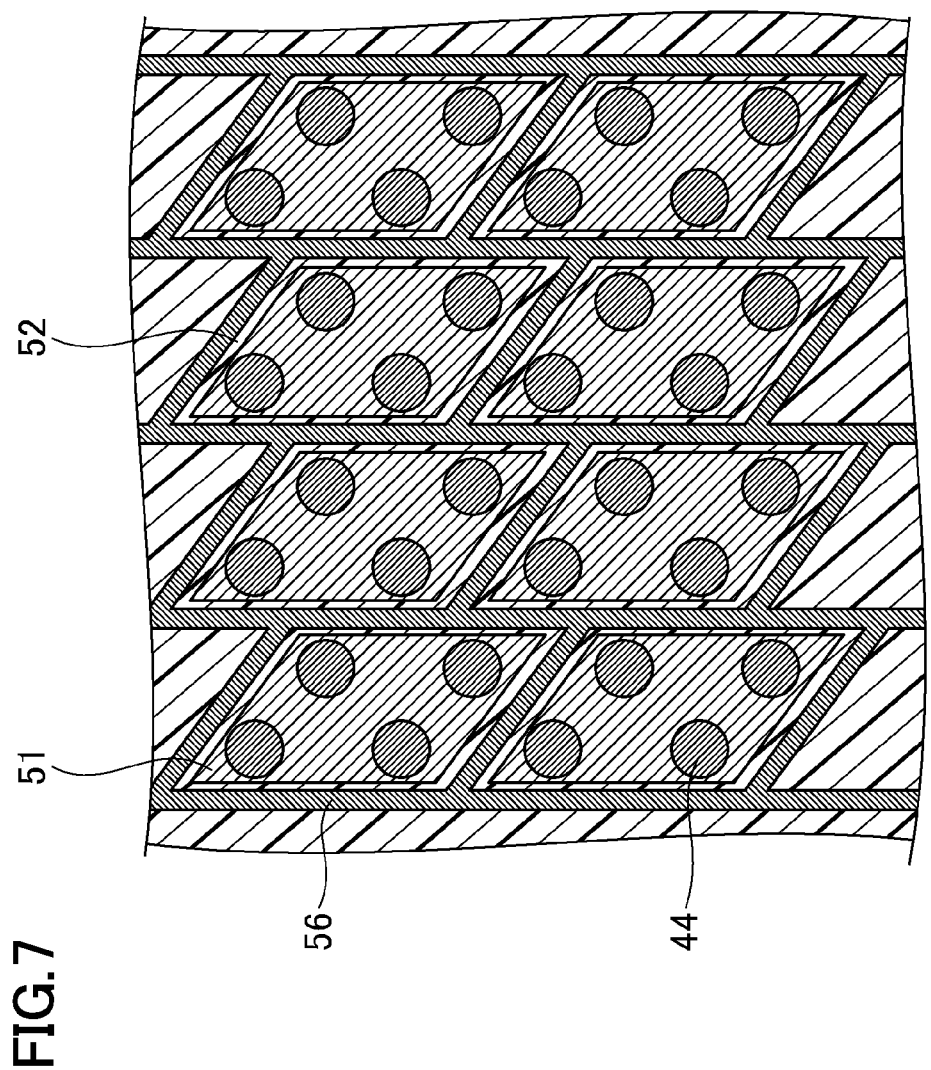
FIG. 7 is a plan view showing an arrangement relation of the electrode, the light-emitting elements, the first insulating layer and the second insulating layer in the display device according to the embodiment.

The shape of the light emitting element 44 is not limited to a rectangular shape but may be polygonal shape or a circular shape as shown in FIG. 6 and FIG. 7.

In an example shown in FIG. 6, two light emitting elements 44 are arranged as a set, and the first insulating layer 51 is formed so as to overlap with a forming area of one set in plan view. Not-shown banks are formed among plural sets, and the second insulating layer 52 is arranged so as to overlap with portions among these plural sets in plan view. Furthermore, the electrodes 56 are arranged so as to overlap with the second insulating layer 52. A set of the light emitting elements 44 is arranged in one rectangular area surrounded by the electrodes 56.

In an example shown in FIG. 7, four light emitting elements 44 are arranged as a set, and the first insulating layer 51 is formed so as to overlap with a forming area of one set in plan view. Not-shown banks are formed among plural sets, and the second insulating layer 52 is arranged so as to overlap with portions among these plural sets in plan view. Furthermore, the electrodes 56 are arranged so as to overlap with the second insulating layer 52. In the example shown in FIG. 7, one area surrounded by the electrodes 56 has a parallelogram shape, and a set of light emitting elements 44 is arranged in the area.

As shown in FIGS. 2 and 3, a second substrate 70 is bonded to an upper surface of the touch sensor 54. The second substrate 70 is made of, for example, materials having high transmitting properties with respect to a visible light region such as resin and glass, and may also include a cover glass, a polarizing plate, a protective layer and so on or may be a layer having flexibility in the same manner as the first substrate 10. A not-shown adhesive is used for bonding the second substrate 70.

The display device 100 is not limited to the organic electroluminescence display device, and may be a display device including a light emitting element such as a quantum-dot light emitting diode (QLED) in each pixel or may be a liquid crystal display device.

The present invention is not limited to the above-described embodiment and various modifications may occur. For example, the structure explained in the embodiment may be replaced with substantially the same structure, a structure having the same operation and effect or a structure that can achieve the same object.

Furthermore, regarding the above-described embodiment, any additional advantage and effect which are obvious from the description of the specification or appropriately conceived by a skilled person are considered to be naturally achievable by the present invention.

What is claimed is:
1. A display device comprising:
   a first substrate;
   light emitting elements arranged on the first substrate and including a first electrode and a second electrode;
   a first insulating layer covering an edge of the first electrode on the first substrate, the second electrode is on the first insulating layer;
   a second insulating section arranged on the light emitting elements and overlapping with the light emitting elements in plan view;
   a third insulating section arranged on the first insulating layer, overlapping with the first insulating layer in plan view and having a lower refractive index than a refractive index of the second insulating section, wherein
   an upper surface of the second insulating section is flat or convex.
2. The display device according to claim 1, further comprising:
   a touch sensor arranged on the second insulating section and the third insulating section and having a metal thin wire overlapping with the third insulating section in plan view.
3. The display device according to claim 2,
   wherein the metal thin wire overlaps with the first insulating layer without overlapping with the third insulating section in plan view.
4. The display device according to claim 2,
   wherein a width of the metal thin wire is equal to or smaller than a width of the third insulating section.
5. The display device according to claim 1,
   wherein the second insulating section and the third insulating section are formed in the same layer.
6. The display device according to claim 2,
   wherein the second insulating section and the third insulating section are formed in the same layer.
7. The display device according to claim 4, further comprising:
   a first inorganic insulating layer arranged between the second insulating section and the light emitting elements and between the third insulating section and the first insulation layer.
8. The display device according to claim 4, further comprising:
   a second inorganic insulating layer,
   wherein the second insulating section is between the first inorganic layer and the second inorganic layer, and the third insulating section is between the first inorganic layer and the second insulating section.
9. The display device according to claim 2,
   wherein a cross-sectional shape of the metal thin wire is a substantially trapezoidal shape.
10. The display device according to claim 1,
    wherein a difference between the refractive index of the second insulating section and the refractive index of the third insulating section is greater than 0.3.
11. The display device according to claim 1,
    wherein a relative dielectric constant of the third insulating section is less than 3.
12. The display device according to claim 1,
    wherein the refractive index of the second insulating section is greater than 1.75.

* * * * *